(12) United States Patent
Shan

(10) Patent No.: US 6,300,216 B1
(45) Date of Patent: Oct. 9, 2001

(54) STRUCTURE AND METHOD FOR FORMING A CAPACITOR DIELECTRIC USING YTTRIUM BARIUM COPPER OXIDE

(75) Inventor: Pao-Chuan Shan, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/756,012

(22) Filed: Jan. 8, 2001

Related U.S. Application Data

(62) Division of application No. 09/385,508, filed on Aug. 30, 1999, now Pat. No. 6,197,651.

(51) Int. Cl.$^7$ ................................................ H01L 21/20
(52) U.S. Cl. ................................................ 438/396; 438/3
(58) Field of Search .............................. 438/3, 238, 239, 438/240, 253, 381, 396, 431, 132, 215, 281, 333, 601, 637

(56) References Cited

U.S. PATENT DOCUMENTS

| | | | |
|---|---|---|---|
| 4,882,312 | * 11/1989 | Mogro-Campero et al. | ............ 505/1 |
| 5,430,009 | * 7/1995 | Wang | ................................. 505/106 |
| 5,555,486 | * 9/1996 | Kingon et al. | ..................... 361/305 |
| 5,879,957 | * 3/1999 | Joo | ........................................ 438/3 |
| 6,174,802 | * 1/2001 | Huang et al. | ..................... 438/637 |
| 6,612,686 | * 12/2000 | Huang et al. | ..................... 438/281 |

* cited by examiner

Primary Examiner—David Nelms
Assistant Examiner—Phuc T. Dang
(74) Attorney, Agent, or Firm—George O. Saile; Stephen B. Ackerman; Willaim J. Stoffel

(57) ABSTRACT

A method and structure for forming a capacitor in a semiconductor device using a high dielectric constant, yttrium barium copper oxide layer as the capacitor dielectric layer. The process begins by providing a semiconductor structure having a conductive plug therein and having an opening, with sidewalls, over the conductive plug. The opening is shaped to accomodate a capacitor structure as is known in the art. A first conductive layer is formed on the conductive plug and on the sidewalls of the opening. A yttrium barium copper oxide layer is deposited on the first conductive layer using a sputtering process with a $YBa_2Cu_3O_7$ target. The yttrium barium copper oxide layer can be annealed to control the oxygen content. For example, $YBa_2Cu_3O_{6+X}$ can be controlled at between X=0.2 and X=0.5. A second conductive layer is formed on the yttrium barium copper oxide layer, thereby forming a capacitor comprising the first conductive layer, the yttrium barium copper oxide layer, and the second conductive layer.

4 Claims, 2 Drawing Sheets

STRUCTURE AND METHOD FOR FORMING A CAPACITOR DIELECTRIC USING YTTRIUM BARIUM COPPER OXIDE

This is a division of patent application Ser. No. 09/385,508, filing date Aug. 30, 1999, now U.S. Pat. No. 6,197,651, Structure And Method For Forming A Capacitor Dielectric Using Yttrium Barium Copper Oxide, assigned to the same assignee as the present invention.

BACKGROUND OF INVENTION

1) Field of the Invention

This invention relates generally to fabrication of a semiconductor device and more particularly to a structure and method for forming a capacitor on a semiconductor structure by depositing a yttrium barium copper oxide layer over a first plate electrode layer at room temperature using a sputtering process.

2) Description of the Prior Art

Currently, oxide/nitride/oxide (ONO) or oxide/nitride (ON) stacks are primarily used as capacitor dielectric layers in DRAM fabrication. However, as device dimensions continue to shrink, capacitors formed using ONO or ON as the capacitor dielectric material are not able to provide the necessary capacitance with the reduced surface area.

New high dielectric constant materials have been developed to provide increased capacitance for a given surface area. Among these newly developed materials are Ta2O5, BST, and PZT. Each of these materials suffer drawbacks for use as a capacitor dielectric material for mass production of silicon-based intergrated circuits.

For example, $Ta_2O_5$, BST, and PZT all have high leakage currents. While these leakage currents can be reduced using a high temperature anneal, high temperature anneals are detrimental to DRAM devices. Also, BST and PZT are difficult to deposit as thin films.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,075,281 (Testardi) shows a yttrium barium copper oxide ($YBa_2Cu_3O_6$) high dielectric constant layer for capacitors fabricated by heating a pre-formed sample of $YBa_2Cu_3O_6$ material to a temperature of at least 850° C. and rapidly quenching it.

U.S. Pat. No. 5,348,894 (Gnade et al.) discloses various high K dielectric layers.

U.S. Pat. No. 5,605,858 (Nishoka et al.) shows a yttrium oxide capacitor dielectric.

U.S. Pat. No. 5,821,598 (Butler et al.) discloses a yttrium barium copper oxide infrared detector.

U.S. Pat. No. 5,851,896 (Summerfelt et al.) shows various oxide layers for high dielectric materials.

U.S. Pat. No. 5,555,486 (Kingon et al.) shows a "YBCO" (yttrium barium copper oxide) as a conductive metal oxide for a capacitor rather than as a capacitor dielectric.

SUMMARY OF THE INVENTION

It is an object of the present invention to provide a structure and method for forming a capacitor on a semiconductor substrate using yttrium barium copper oxide as a capacitor dielectric material.

It is another object of the present invention to provide a structure and method for forming a capacitor over a semiconductor substrate using a sputter deposited thin film of $YBa_2CU_3O_{6+X}$ (0.2<x <0.5), $Y_2BaCuO_5$, and/or amorphous yttrium barium copper oxide as a capacitor dielector layer.

It is another object of the present invention to provide a method for forming a yttrium barium copper oxide film at low temperature having a high dielectric constant which can be easily patterned and provides good end point detection during etching.

It is yet another object of the present invention to provide an economical and manufacturable method for forming a high dielctric constant film for use as a capacitor dielectric layer.

To accomplish the above objectives, the present invention provides a method for forming a high-K film at low temperature by sputter depositing a yttrium barium copper oxide layer from a $YBa_2Cu_3O_7$ target and vacuum annealing the yttrium barium copper oxide layer at low temperature to control the oxygen content and therefore the dielectric constant. In a preferred embodiment, the present invention provides a method and structure for forming a capacitor in a semiconductor device using a high dielectric constant, yttrium barium copper oxide layer as the capacitor dielectric layer. The process begins by providing a semiconductor structure having a conductive plug therein and having an opening, with sidewalls, over the conductive plug. The opening is shaped to accomodate a capacitor structure as is known in the art. A first conductive layer is formed on the conductive plug and on the sidewalls of the opening. A yttrium barium copper oxide layer comprising: $YBa_2Cu_3O_{6+X}$ (0.2<x <0.5), $Y_2BaCuO_5$, and/or amorphous YBaCuO is deposited on the first conductive layer using a sputtering process with a $YBa_2Cu_3O_7$ target. The $YBa_2Cu_3O_{6+X}$ layer can be annealed to control the oxygen content of the yttrium barium copper oxide. For example, $YBa_2Cu_3O_{6+X}$ can be controlled at between X=0.2 and X=0.5. A second conductive layer is formed on the yttrium barium copper oxide layer, thereby forming a capacitor comprising the first conductive layer, the yttrium barium copper oxide layer, and the second conductive layer.

The present invention provides considerable improvement over the prior art. A sputter deposited and annealed yttrium barium copper oxide layer with the oxygen content controlled at at the desired level can provide a dielectric constant of between about 70 and 100, which is about 10 times higher than ONO. A capacitor dielectric layer using this high dielectric constant material allows higher packing density because comparable capacitance can be acheived with less surface area.

By using a sputter process to deposit the high dielectric constant yttrium barium copper oxide layer, it can be deposited at lower temperatures than other capacitor dielectric materials known in the art. It can also be formed at lower temperatures than other "YBCO" processes described in the prior art. This lower processing temperature is particularly advantagous in DRAM fabrication. The sputter deposition and anneal steps of the present invention provide good control of thickness and oxygen content, thereby providing good control of the dielectric constant. Also, yttrium barium copper oxide is easy to pattern and its black color makes end point detection easy.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

Detailed Description of the Invention

The present invention provides a method for forming a high-K dielectric film at low temperature by sputter depositing a yttrium barium copper oxide layer and vacuum annealling it at low temperature to control the oxygen content and therefore the dielectric constant.

The process begins by providing a semiconductor structure. Semiconductor structure is to be understood to include a substrate such as a silicon wafer, and to possibly include one more conductive layers and/or dielectric layers overlying the substrate. Semiconductor structure is understood to possibly further include one or more devices formed in the substrate and/or overlying layers.

A high dielectric constant yttrium barium copper oxide layer is formed over the semiconductor structure. The inventor has found that dielectric constant for yttrium barium copper oxide varies with oxygen content. For example, at room temperature (10° C. to 25° C.), $YBa_2Cu_3O_{6+X}$ (X=1) has essentially metallic conductivity, and $YBa_2Cu_3O_{6+X}$ (X=0) is semi-insulating. In the present invention, the yttrium barium copper oxide layer is deposited by sputtering it from a $YBa_2Cu_3O_7$ target at a power of between about 50 W and 300 W, and at a pressure of between about 5 mTorr and 20 mTorr.

The oxide content of the yttrium barium copper oxide layer can be controlled by annealing the yttrium barium copper oxide layer in a vacuum, at a temperature of between about 400° C. and 650° C. For example, the oxygen content of $YBa_2Cu_3O_{6+X}$ is controlled at between about X=0.2 and X=0.5. The resulting yttrium barium copper oxide layer preferably has a dielectric constant of between about 70 and 100.

Key advantages of the yttrium barium copper oxide film formed according to the present invention are that it provides a high dielectric constant with low processing temperatures. Also, the yttrium barium copper oxide film formed according to the present invention can be easily patterned and provides good end point detection during etching.

Preferred Embodiment

A preferred embodiment of the present invention will be described in detail with reference to the accompanying drawings. In this preferred embodiment, a method and structure for a capacitor is described, using a sputter deposited and vacuum annealed yttrium barium copper oxide layer as a capacitor dielectric layer.

Figure 1:
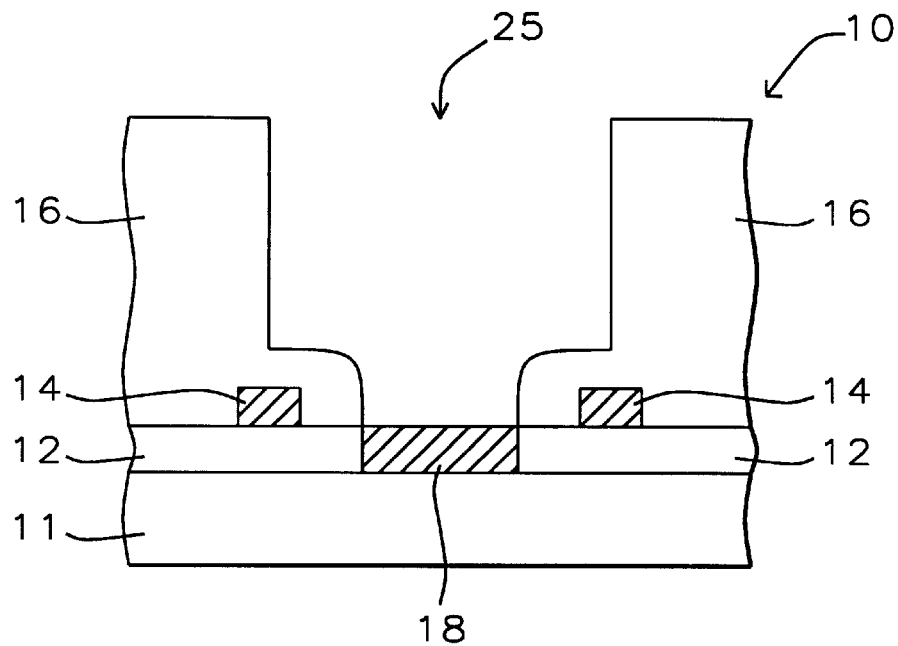
FIGS. 1, 2, 3 & 4 illustrate sequential sectional views of a process for forming a capacitor in a semiconductor device using a sputter deposited yttrium barium copper oxide film as a capacitor doeilectric according to the inventor's current process.

Referring to FIG. 1, the process begins by providing a semiconductor structure (10) such as for a DRAM. Semiconductor structure is to be understood to include a substrate such as a silicon wafer, and to possibly include one more conductive layers and/or dielectric layers overlying the substrate. Semiconductor structure is understood to possibly further include one or more devices formed in the substrate and/or overlying layers. The semiconductor structure (10) illustrated in FIG. 1 comprises a substrate (11) with an overlying first dielectric layer (12) having bit lines (14) on the first dielectric layer (12) and a conductive plug (18) formed in the first dielectric layer (12) between the bit lines. A second dielectric layer (16) is formed over the bit lines. An opening (25) having sidewalls is formed in the second dielectric layer over the conductive plug (18). It should be noted that other semiconductor substrate configurations could be provided as are known to one skilled in the art.

Figure 2:
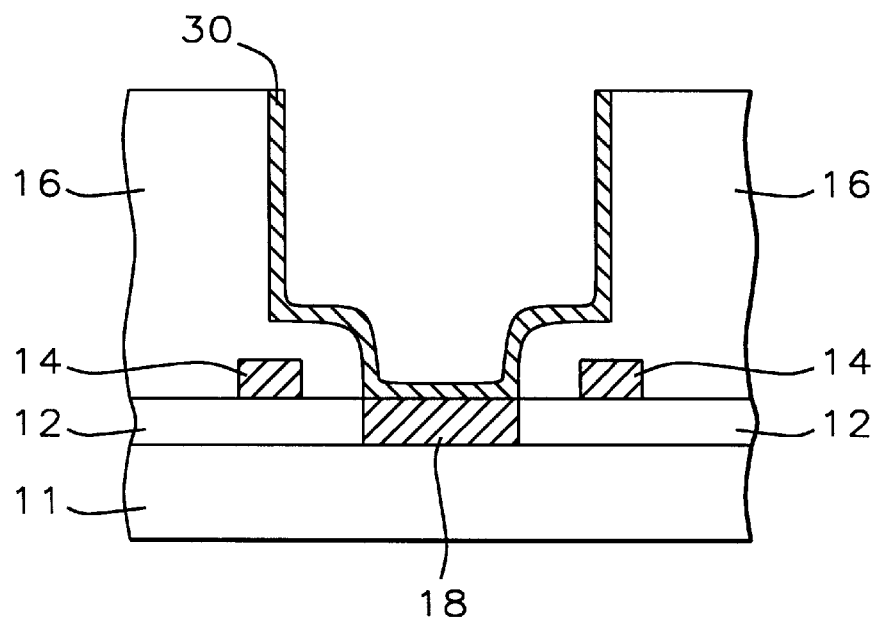

Referring to FIG. 2, a first conductuive layer (e.g. bottom electrode) (30) is formed on the conductive plug (18) and the sidewalls of the opening (25). The first conductive layer (30) can be composed of a number of conductive materials, including: polysilicon, niobium, aluminum, or platinum. The first conductive layer can be formed using a chemical vapor deposition, plasma enhanced chemical deposition, or most preferably a physical vapor deposition (e.g. sputtering) process, and preferably has a thickness of between about 1000 Angstroms and 5000 Angstroms. The first conductive layer is removed to the level of the top of the second dielectric layer (16).

Figure 3:
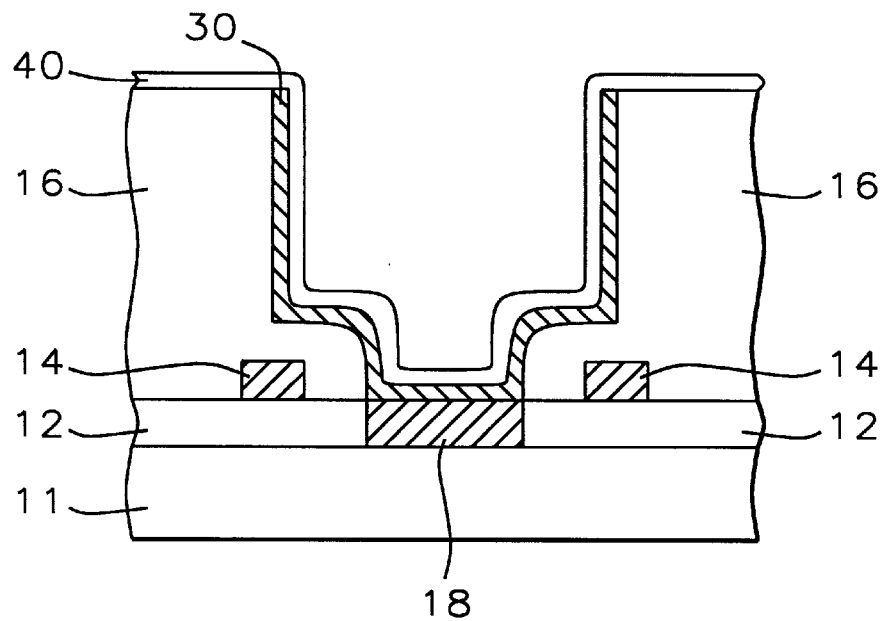

In the first key step, a high dielectric constant yttrium barium copper oxide layer (40) is formed over the first conductive layer (30) and the second dielectric layer (16) as shown in FIG. 3. In the present invention, the yttrium barium copper oxide layer (40) is preferably deposited at room temperature by sputtering it from a $YBa_2Cu_3O_7$ target at a power of between about 50 W and 300 W, and at a pressure of between about 5 mTorr and 20 mTorr. The yttrium barium copper oxide layer (40) is preferably deposited to a thickness of between about 50 Angstroms and 500 Angstroms.

In the second key step, the oxide content of the yttrium barium copper oxide layer (40) can be annealed to control the oxygen content, optimizing the dielectric constant of the yttrium barium copper oxide layer (40). The yttrium barium copper oxide layer (40) is annealed in a vacuum at a temperature of between about 400° C. and 650° C. The yttrium barium copper oxide layer (40) preferably has a dielectric constant of between about 70 and 100.

Alternatively, the annealing step may be omitted and an amorphous yttrium barium copper oxide layer can be used as the yttrium barium copper oxide layer (40).

Figure 4:
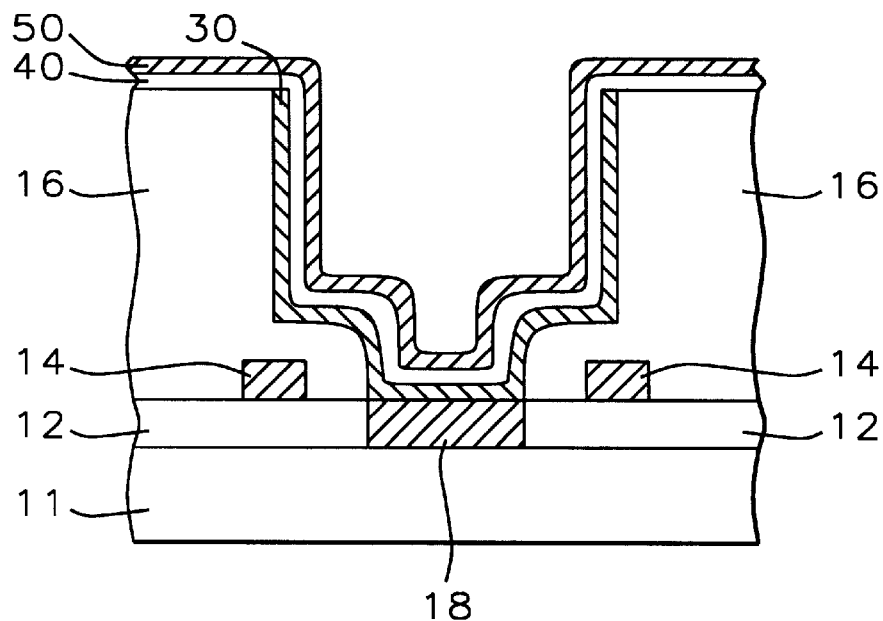

Referring to FIG. 4, a second conductive layer (e.g. top electrode) (50) is formed on the yttrium barium copper oxide layer (40), thereby forming a capacitor comprising the first conductive layer (30) the yttrium barium copper oxide layer,(40), and the second conductive layer (50). The second conductive layer (50) can be composed of a number of conductive materials, including: polysilicon, niobium, aluminum, or platinum. The first conductive layer can be formed using a chemical vapor deposition, plasma enhanced chemical deposition, or sputtering process, and preferably has a thickness of between about 1000 Angstroms and 5000 Angstroms.

The preceding figures and description illustrate a preferred embodiment of a capacitor fabricated according to the present invention. Any capacitor structure can be used with the invention's yttrium barium copper oxide capacitor dielectric layer.

While the invention has been particularly shown and described with reference to the preferred embodiments thereof, it will be understood by those skilled in the art that various changes in form and details may be made without departing from the spirit and scope of the invention.

What is claimed is:

1. A capacitor structure formed in a semiconductor device comprising:
   a first conductive layer deposited on a semiconductor structure;
   a dielectric layer comprising yttrium barium copper oxide deposited on said first conductive layer; and
   a second conductive layer deposited on said dielectric layer.

2. The capacitor of claim 1 wherein said first conductive layer has a thickness of between about 1000 Angstroms and 5000 Angstroms, said dielectric layer has a thickness of between about 50 Angstroms and 500 Angstroms, and said second conductive layer has a thickness of between about 1000 Angstroms and 5000 Angstroms.

3. The capacitor of claim 1 wherein said dielectric layer comprises $YBa_2Cu_3O_{6+X}$ (0.2<X<0.5) formed using a sputtering process with a $YBa_2Cu_3O_7$ target, at a power of between about 50 Watts and 300 Watts, and at a pressure of between about 5 mTorr and 20 mTorr, and annealing in a vacuum at a temperature of between about 400° C. and 650° C.

4. The capacitor of claim 1 wherein said dielectric layer comprises amorphous yttrium barium copper oxide formed using a sputtering process with a $YBa_2Cu_3O_7$ target, at a power of between about 50 Watts and 300 Watts, and at a pressure of between about 5 mTorr and 20 mTorr.

* * * * *